United States Patent [19]
Lin et al.

[11] Patent Number: 5,504,370
[45] Date of Patent: Apr. 2, 1996

[54] ELECTRONIC SYSTEM CIRCUIT PACKAGE DIRECTLY SUPPORTING COMPONENTS ON ISOLATED SUBSEGMENTS

[75] Inventors: Peng-Cheng Lin, Cupertino; Hem P. Takiar, Fremont, both of Calif.

[73] Assignee: National Semiconductor Corporation, Santa Clara, Calif.

[21] Appl. No.: 306,668

[22] Filed: Sep. 15, 1994

[51] Int. Cl.⁶ .............................. H01L 25/03; H01L 27/07
[52] U.S. Cl. .......................... 257/676; 257/666; 257/668; 257/723
[58] Field of Search ..................................... 257/666, 668, 257/672, 675, 676, 684, 687, 666.4

[56] References Cited

U.S. PATENT DOCUMENTS

| | | | |
|---|---|---|---|
| 4,297,647 | 10/1981 | Akiyama et al. | 257/532 |
| 4,859,633 | 10/1989 | Bayraktaroglu | 257/713 |
| 5,115,298 | 5/1992 | Loh | 257/691 |
| 5,198,824 | 3/1993 | Poradish | 257/728 |
| 5,321,299 | 6/1994 | Ohkawa et al. | 257/531 |

FOREIGN PATENT DOCUMENTS

| | | | |
|---|---|---|---|
| 2-229460 | 9/1990 | Japan | 257/666 |
| 3-40452 | 2/1991 | Japan | 257/666 |

*Primary Examiner*—Robert P. Limanek
*Assistant Examiner*—Alexander Oscar Williams

[57] ABSTRACT

An electronic system circuit package is disclosed herein. The package utilizes a lead frame having an electrically conductive component support segment incorporating provisions for mounting a plurality of electronic components directly on the support segment in accordance with a predetermined circuit design. The circuit package is then encapsulated in a dielectric medium. In a preferred embodiment, at least some of the electronic components are mounted directly to electrically isolated subsegments of the component support segment and electrically interconnected through their respective subsegments to other components.

19 Claims, 3 Drawing Sheets

ELECTRONIC SYSTEM CIRCUIT PACKAGE DIRECTLY SUPPORTING COMPONENTS ON ISOLATED SUBSEGMENTS

BACKGROUND OF THE INVENTION

The present invention relates generally to an electronic system circuit package, and more particularly to a package including a lead frame having a unique and specific design with provisions for electrically interconnecting a plurality of passive and active electronic components, at least in part directly by means of the lead frame in accordance with a specific predetermined circuit design.

In integrated circuit packaging, a lead frame is typically used to support an integrated circuit within an integrated circuit package as well as to provide electrically conductive leads for the connection of the integrated circuit to other circuit elements outside the package. To date, as a general rule only the integrated circuit itself has been mounted directly to the lead frame within the integrated circuit package, while other cooperating components have typically been placed outside the package. This segregation of components leads to a multiplicity of problems encountered in circuit design which problems are solved by the present invention, also to be discussed below.

A past solution was to include some components within the integrated circuit package by mounting those components to a dielectric substrate which was then, in turn, mounted to the lead frame. This prior art method introduces an additional layer of thermal impedance from the parts mounted on the substrate to the lead frame, since the substrate is typically a poor thermal conductor as compared with metal lead flames. As will be seen hereinafter in accordance with the present invention, mounting and electrically connecting parts directly to the lead frame avoids the need for a substrate. Components mounted directly to the lead frame will exhibit improved heat dissipation characteristics since the metal lead frame is an efficient conductor of heat. Higher manufacturing costs and complexity will also be avoided as a result of eliminating the use of a substrate. Material cost would be reduced as well because substrate material is no longer needed.

Circuit designers are forced in many instances to use components external to the circuit package to meet design requirements, each additional required external component adding cost, lowering reliability and causing the overall size of the electronic package to increase. These external pans must be mounted and electrically interconnected by means of technology such as a printed circuit board. If all parts are mounted within the lead frame itself the need for a printed circuit board to mount the external parts on is obviated and a manufacturing cost savings is realized. Further, a compact design is obtained by containing all components exclusively on the lead frame with no external pans, in fact, the look and feel of an IC package may be maintained, allowing the circuit package itself to be mounted directly to a pc board.

Electrical connections of external components, even on a pc board, are typically not as reliable as those made within the integrated circuit package. Overall reliability of the electrical interconnections are therefore improved by housing all the interconnections within the circuit package. Reliability of the package is also improved with regard to environmental resistance of the package. A past solution was to house a module type electronic package within a custom plastic housing. This housing is expensive to produce and has been shown to be substandard with regard to moisture resistance. Incorporating all components within the lead frame, as the present invention teaches, allows the circuit package to be encapsulated by means typically used to encapsulate an individual IC. These methods, such as potting, have proven to be very environmentally resistant.

SUMMARY OF THE INVENTION

In accordance with the present invention, it is desirable to mount electronic components directly to the lead frame wherever possible and to electrically interconnect the components, at least in part, by means of the metal lead frame itself. The invention also teaches a new method of electrically interconnecting components by electrically connecting them to subsegments of the lead frame whereby bonding wires can be electrically welded directly to the subsegments to form strong, reliable bonds. The electrical connection is thereby completed to these components through the subsegments to which each component is electrically connected.

As will be described in more detail hereinafter, an electronic system circuit package is disclosed herein along with its method of manufacture. The package includes a lead frame with an electrically conductive component support segment having a series of associated electrically conductive leads. A plurality of electronic components including at least one IC chip and one individual active element are mounted directly to the support segment of the lead frame. The electronic components and the conductive leads are electrically interconnected to one another in accordance with a predetermined circuit design. The electronic components, the lead frame support segment, the electrical interconnections and portions of the electrically conductive leads are encapsulated in a dielectric medium. In a preferred embodiment, at least some of the electronic components are mounted directly to electrically isolated subsegments of the support segment and electrically interconnected through their respective subsegments to other components.

BRIEF DESCRIPTION OF THE DRAWINGS

The present invention may be understood by reference to the following description taken in conjunction with the following drawings in which.

DETAILED DESCRIPTION OF THE PREFERRED EMBODIMENTS

Figure 1:
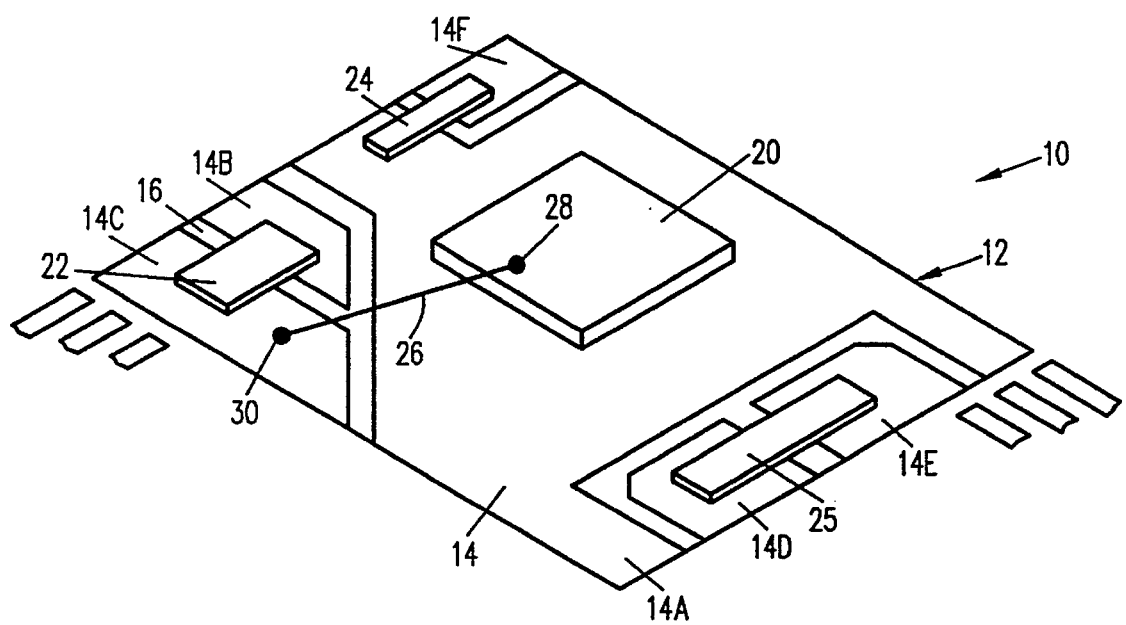
FIG. 1 is a schematic illustration, in a perspective view, of an electronic system circuit package showing a lead frame with electronic components mounted thereon in accordance with the present invention.

Referring initially to FIG. 1, an electronic system circuit package designed in accordance with the present invention and generally designated by the reference numeral 10 will be described. The package includes a lead frame 12 having an electrically conductive support segment 14 divided into a plurality of electrically conductive subsegments 14A, 14B, 14C, 14D, 14E and 14F. The subsegments are arranged and designed in accordance with a predetermined overall circuit diagram, as will be described hereinafter. The subsegments are electrically isolated from one another by insulating slots, an example of which is shown at 16.

The overall electronic system circuit package includes a plurality of electronic components, each of which is mounted at least in part directly on one of the subsegments. As illustrated in FIG. 1, an IC chip is designated by reference numeral 20, a capacitor is designated by reference numeral 22, a resistor is shown at 24 and a diode is depicted at 25.

Mounting and electrical interconnection of the components on the circuit of FIG. 1 are accomplished by a number of techniques. Electronic components are mounted directly to support segment 14 and contact at least one subsegment of the support segment in being so mounted. Components may be electrically isolated from the support segment, if so desired, as will be shown in relation to a later figure, or components may be mounted by electrically connecting them to one or more subsegments. Capacitor 22 shown in FIG. 1 is connected electrically to subsegment 14B at a first end and to subsegment 14C at a second end. These connections may be accomplished by conventional means, for example conductive epoxy or solder. An insulating slot 16 extends under capacitor 22 causing subsegments 14B and 14C to be electrically isolated with the capacitor electrically connected therebetween. Subsegments 14B and 14C are formed specifically for receiving capacitor 22.

In the case of mounting and electrically connecting an active or passive component, the subsegments are customized for the specific design parameters of concern. IC 20, for example, is shown directly mounted to subsegment 14A. Subsegment 14A must be properly shaped to form an appropriate foundation for IC 20. Heat transfer from IC 20 to subsegment 14A and heat transfer from the other components in the package mounted to their respective lead frame subsegments is enhanced by the direct connection of these components to their respective subsegments since lead frame 12 constitutes an efficient heat sink.

Bonding wires are also used to complete electrical interconnections within the circuit package. A bonding wire is shown at reference numeral 26. Bonding wire 26 is attached to a pad 28 on IC 20 at one end. This is a typical application of a bonding wire to an IC chip or other component. In accordance with the present invention, the opposite end of bonding wire 26 is bonded directly to subsegment 14C at an attachment point 30. The bonded connection shown at 30 is electrically conductive and will normally comprise an electrical weld. An electrical weld to electrically conductive subsegment 14C will form a strong and permanent electrical connection to the subsegment and, since capacitor 22 is electrically connected at one end to subsegment 14C, pad 28 on IC 20 is electrically connected to one end of capacitor 22 via bonding wire 26 and subsegment 14C. Any number of bonding wires may be electrically connected to subsegment 14C by this method.

Capacitor 24, in FIG. 1, has an electrical contact at each opposing end. A first end of the capacitor is mounted directly to subsegment 14A. The opposing end of capacitor 24 is mounted directly to subsegment 14F and is electrically connected thereto, so that capacitor 24 is electrically connected between subsegments 14A and 14F. Resistor 25 may be a typical surface mount resistor having an electrical contact at each opposite end. A first end of resistor 25 is electrically connected directly to subsegment 14D and the opposite end is electrically connected directly to subsegment 14E. Electrical connections of capacitor 24 and resistor 25 to their respective subsegments may be completed using solder paste or other means well known in the art.

Figure 2:
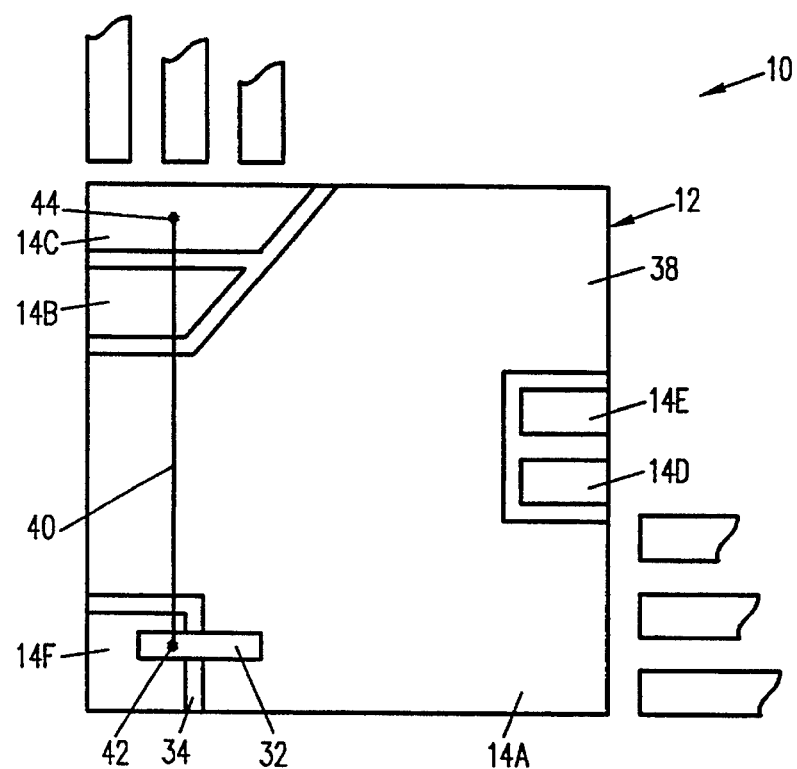
FIG. 2 is a bottom (underside) plan view of the electronic system circuit package of FIG. 1.

FIG. 2 is a bottom, underside, plan view of FIG. 1 and illustrates an additional aspect of the invention. A transistor is shown at reference numeral 32. The opposite ends of the transistor may, for example comprise the emitter and collector terminals. The transistor 32 is electrically mounted between subsegments 14A and 14F across an insulating slot 34 on the bottom side 38 of lead frame 10, whereby the emitter and collector terminals are electrically connected to subsegments 14A and 14F respectively. Any number of components may be mounted on the bottom 38 of lead frame 10 and electrically interconnected between the subsegments in this manner.

A bonding wire 40 is shown at one end electrically connected to a pad 42 representing the base of transistor 32. The opposite end of bonding wire 40 is electrically welded to subsegment 14C at 44, whereby the base of transistor 32 is electrically connected to subsegment 14C, illustrating that this method may also be used on the bottom side of lead frame 12.

Figure 3:
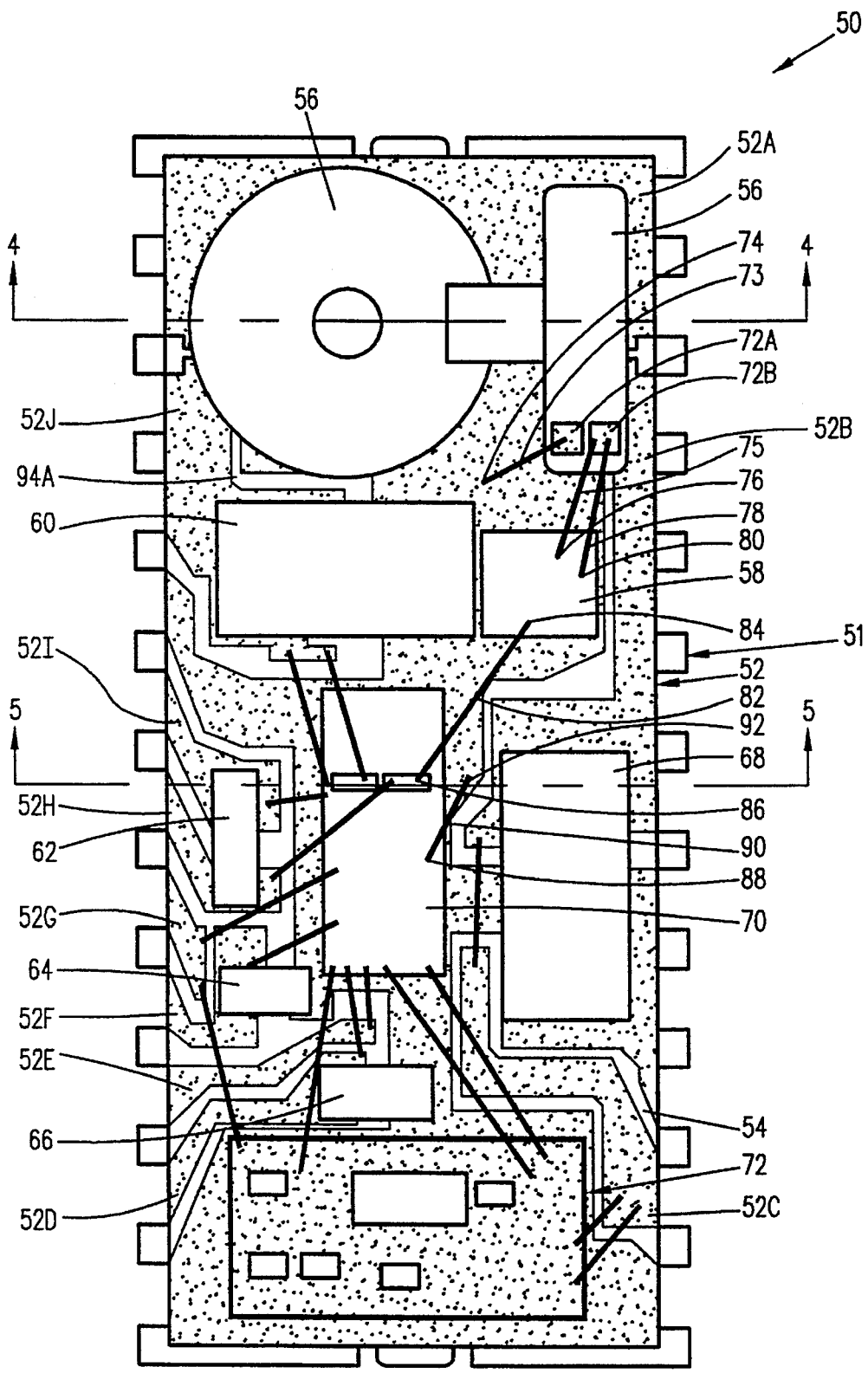
FIG. 3 is a diagrammatic plan view of a prototype lead frame based power supply system utilizing the present invention.

A prototype switch mode power supply using the present invention is shown in FIG. 3. The prototype is generally designated by the reference numeral 50. The circuit design comprises a switch mode power supply. The lead frame used in the power supply is designated as 51 in FIG. 3. The lead frame includes an electrically conductive component support segment 52, which is divided into a plurality of electrically conductive subsegments 52A through 52J. The subsegments are isolated from one another by insulating slots, an example of which is shown at 54.

An inductor 56 is also shown in FIG. 3 along with a diode 58; capacitors of various sizes are shown by reference numerals 60, 62, 64, 66 and 68; an IC 70; and a dielectric substrate 72 with thick film printed resistors and a chip capacitor. Dielectric substrate 72 has a plurality of components mounted thereon, typical of the prior art, and was not used to illustrate inventive features disclosed herein, but only to functionally complete the prototype power supply wherein inventive features are used in the remainder of the power supply and described below.

Referring again to FIG. 3, subsegment 52A is held at ground potential and also functions as a ground plane. A subsegment, such as 52A, may be designed to function as a ground plane with such considerations as electronic interference shielding and component grounding requirements in mind. Any number of component electrical connections to ground may be accomplished in accordance with the present invention by utilizing a grounded subsegment, as will be seen below.

Inductor 56 has a pair of bonding pads 72A and 72B. A bonding wire 73 is electrically connected at one end to pad 72A on the inductor. The opposite end of bonding wire 73 is electrically bonded to subsegment 52A of the lead frame at attachment point 74, since subsegment 52A is held at ground potential, pad 72A on the inductor is thereby grounded by means of bonding wire 73, as taught by the present invention. Diode 58 is electrically connected to subsegment 52A by being directly mounted thereto, illustrating that a component may be electrically grounded by direct mounting to a grounded subsegment in accordance with the invention herein disclosed.

A bonding wire 75 is bonded at one end to diode 58 at attachment point 76. The opposite end of bonding wire 75 is electrically connected to bonding pad 72B on inductor 56. A bonding wire 78 parallels bonding wire 75. Bonding wire 78 is electrically connected to pad 72B on the inductor at a first end and electrically connected to diode 58 at attachment point 80. Bonding wires may be paralleled in this manner, for example, due to circuit demands for increased carrying capacity. Bonding wire 82 is electrically connected at one end to diode 58 at attachment point 84 and at an opposite end is electrically connected to a bonding pad 86 on IC 70, illustrating that a multitude of bonding wires may be connected to an electrically common point on the diode. A plurality of bonding wires may be connected to an electrically common point on any component used with the present invention, in accordance with electrical interconnection requirements.

IC 70 has a grounding terminal 88. A bonding wire 90 is electrically connected at one end to the grounding terminal. The second end of bonding wire 90 is electrically connected to subsegment 52A at attachment point 92, whereby the grounding terminal of the IC is grounded by means of a bonding wire electrically attached to grounded subsegment 52A. Any component mounted on the lead frame support segment, including those components mounted directly to a ground plane subsegment, may be grounded by a bonding wire to said ground plane subsegment per the present invention.

Capacitor 60, previously mentioned, is mounted at one end to subsegment 52A and is thereby grounded. The opposite terminal of capacitor 60 is electrically connected to subsegment 52J. The remaining capacitors 62, 64, 66 and 68 are similarly disposed in that they are all mounted directly to subsegments so as to each be electrically connected to an opposing pair of subsegments across an isolating slot, as can be seen by referring to FIG. 3. The remaining required electrical connections to these capacitors are completed, as shown, utilizing bonding wires as taught by the present invention.

Figure 4:
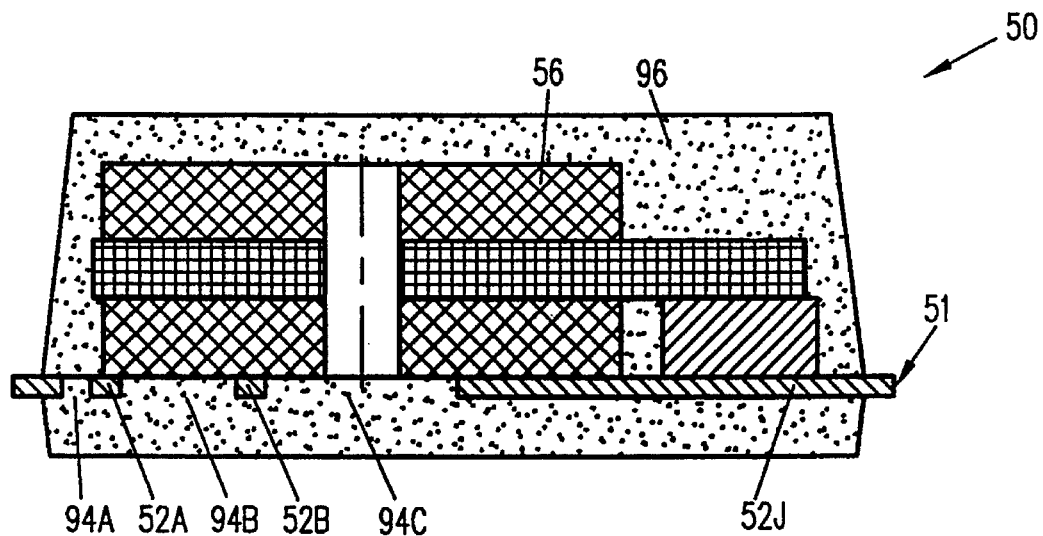
FIG. 4 is a cross-sectional elevational view taken along section 4—4 of FIG. 3.

FIG. 4 shows the inductor 56 and the lead frame 51 in cross-section. Insulating slots 94A, 94B and 94C can be seen FIG. 4. The inductor 56 is mounted to the lead frame support segment 52, contacting subsegments 52A, 52B and 52J. The inductor 56 is not electrically bonded to the subsegments but is simply mounted thereon by means such as dielectric adhesive, well known in the art. Any component, such as the inductor 56, not amenable to direct electrical bonding to the lead frame may be mounted in this fashion. The lead frame and components are encapsulated in a sealed dielectric package 96, shown in FIG. 4. Dielectric package 96 is of the type typically used to encapsulate individual integrated circuits. These packages have proven to be extremely reliable and environmentally resistant.

Figure 5:
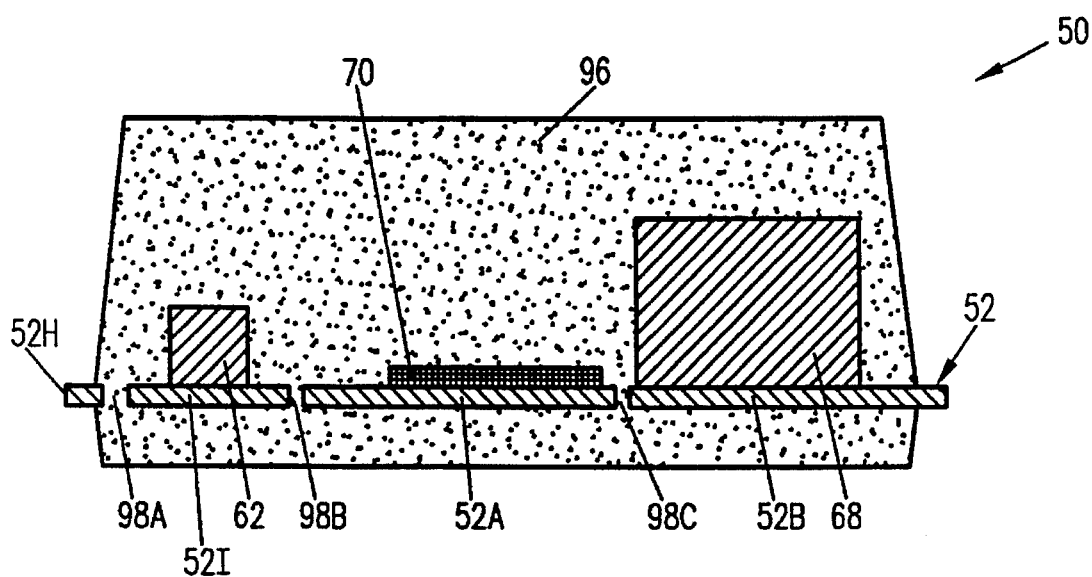
FIG. 5 is a cross sectional elevational view taken along section 5—5 of FIG. 3.

A cross-sectional view of the power supply of FIG. 3 is depicted as FIG. 5. Insulating slots can be seen as 98A, 98B and 98C. Capacitor 62, IC 70 and capacitor 68 are also shown in cross-section and are directly mounted to subsegments of the lead frame 51. Capacitor 62 is directly mounted to subsegment 52I at the point where cross section 5—5 is taken. IC 70 is directly mounted to subsegment 52A and capacitor 68 is directly mounted to subsegment 52B, in accordance with the present invention.

It should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

What is claimed is:

1. An electronic system circuit package, comprising:
   (a) a lead frame including an electrically conductive component support segment unsupported by any other component and a series of electrically conductive leads in close proximity to said support segment;
   (b) a plurality of electronic components including at least one IC chip and one individual active element, each of which is mounted directly to the support segment of said lead frame without any other intervening substrate for the components;
   (c) means for electrically interconnecting said electronic components and said electrically conductive leads to one another in accordance with a predetermined circuit design; and
   (d) a dielectric medium encapsulating said electronic components, said lead frame support segment, said interconnecting means and portions of said electrically conductive leads.

2. An electronic system circuit package according to claim 1 wherein said lead frame support segment includes a first subsegment to which said IC chip is directly mounted and a second subsegment which is electrically isolated from said first subsegment and to which said individual active element is at least in part directly mounted.

3. An electronic system circuit package according to claim 2 wherein said individual active element is electrically connected to the second subsegment of said lead frame support segment by virtue of being at least in part mounted directly to said second subsegment.

4. An electronic system circuit package according to claim 3 wherein said IC chip includes a series of input/output terminals and wherein said interconnecting means includes a bonding wire connected at one end to one of said input/output terminals and at its other end directly to the second subsegment of said lead frame support segment, whereby to electrically connect said individual active element to said IC chip via said second subsegment and said one input/output terminal.

5. An electronic system circuit package according to claim 1 wherein said plurality of electronic components include additional individual active elements, each of which is mounted directly to said lead frame support segment, all of said electronic components being selected and interconnected together along with the electrically conductive leads in accordance with said predetermined circuit design such that the overall electronic circuit system package functions as a switching power supply.

6. An electronic system circuit package according to claim 5 wherein said electronic components include at least one diode, one capacitor and one inductor along with said IC chip.

7. An electronic system circuit package according to claim 6 wherein said lead frame support segment is divided into a plurality of subsegments, at least some of which are electrically isolated from one another, each of said electronic components being individually mounted, at least in pa, to a respective one of said subsegments.

8. An electronic system circuit package according to claim 7 wherein at least one of said electronic components includes a grounding terminal, wherein at least one of said lead frame subsegments is adapted for connection to ground potential in order to serve a ground plate and wherein said interconnecting means include at least one bonding wire connected at one end to the grounding terminal of said last-mentioned one electronic component and at its other end to said last-mentioned subsegment.

9. An electronic system circuit package according to claim 1 wherein said lead frame support segment is divided into a plurality of subsegments, at least some of which are electrically isolated from one another, each of said electronic components being individually mounted, at least in part, to a respective one of said subsegments.

10. An electronic system circuit package according to claim 9 wherein at least one of said electronic components includes a grounding terminal, wherein at least one of said lead frame subsegments is adapted for connection to ground potential in order to serve a ground plate and wherein said interconnecting means include at least one bonding wire connected at one end to the grounding terminal of said last-mentioned one electronic component and at its other end to said last-mentioned subsegment.

11. An electronic system circuit package according to claim 10 wherein said electronic components include at least one diode, one capacitor and one inductor along with said IC chip.

12. An electronic system circuit package according to claim 11 including dielectric adhesive means for fixedly connecting said IC chip and said diode to their respective lead frame subsegments in an electrically isolating manner and wherein each of said IC chip and said diode is electrically connected directly to its respective lead frame subsegment by means of at least one bonding wire.

13. An electronic system circuit package according to claim 12 including electrically conductive adhesive means for fixedly connecting said capacitor and inductor to their respective lead frame subsegments in an electrically connecting manner.

14. An electronic system circuit package according to claim 9 wherein at least one of said electronic components is directly mounted to its respective lead frame subsegment on the opposite side of the lead frame as other ones of said components.

15. A switching power supply system circuit package, comprising:
(a) a lead frame including an electrically conductive component support segment divided into a plurality of subsegments, at least some of which are electrically isolated from one another and a series of electrically conductive leads in close proximity to said support segment;
(b) a plurality of electronic components, each of which is mounted, at least in part, directly to a respective one of said subsegments of said lead frame support segment, said electronic components including at least one IC chip, one diode, one capacitor and one inductor, said components being mounted directly to the subsegments with no other intervening substrate;
(c) means for electrically interconnecting said electronic components and said electrically conductive leads to one another in accordance with a predetermined circuit design such that the overall package functions as a switching power supply circuit; and
(d) a dielectric medium encapsulating said electronic components, said lead frame support segment, said interconnecting means and portions of said electrically conductive leads.

16. A switching power supply system circuit package according to claim 15 wherein at least one of said electronic components is directly mounted to its respective lead frame subsegment on the opposite side of the lead frame as other ones of said components.

17. A lead frame for use as part of an overall electronic systems circuit package which includes a plurality of electronic components, said lead frame comprising:
(a) an electrically conductive component support segment divided into a plurality of subsegments, at least some of which are electrically isolated from one another, each of said subsegments being adapted to support, directly, individual ones of said electronic components without any other intervening substrate for the components; and
(b) a series of electrically conductive leads in close proximity to said support segment.

18. An electronic system circuit package, comprising:
(a) a lead frame including an electrically conductive component support segment which is divided into a plurality of subsegments, at least some of which are electrically isolated from one another and a series of electrically conductive leads in close proximity to said support segment;
(b) a plurality of individual electronic components including at least one IC chip, one capacitor and one inductor, and additional active elements including at least one diode, each of said electronic components being individually mounted, at least in part, directly to a respective one of said subsegments, at least a first one of said individual electronic components being electrically connected to the subsegment to which it is at least in part directly mounted by virtue of being mounted directly to that subsegment;
(c) means for electrically interconnecting said electronic components and said electrically conductive leads to one another in accordance with a predetermined circuit design such that the overall system functions as a switch mode power supply, said means including at least one bonding wire connected at one end directly to that subsegment to which said first component is at least in part mounted and at its other end directly to a second one of said electronic components, whereby to electrically connect together said first and second components; and
(d) a dielectric medium encapsulating said electronic components, said lead frame support segment, said interconnecting means and portions of said electrically conductive leads.

19. An electronic system circuit package comprising:
(a) a lead frame including an electrically conductive component support segment which is divided into a plurality subsegments, at least some of which are electrically isolated from one another, and a series of electrically conductive leads in close proximity to said support segment;
(b) a plurality of electronic components including at least one IC chip and one individual active element, each of said components being individually mounted, at least in part, to a respective one of said subsegments such that at least a first one of said individual electronic components is electrically connected to the subsegment to which it is at least in part directly mounted by virtue of being mounted directly to that subsegment;
(c) means for electrically interconnecting said electronic components and said electrically conductive leads to one another in accordance with a predetermined circuit design, said means including at least one bonding wire connected at one end directly to that subsegment to which said first component is at least in part mounted and at its other end connected directly to a second one of said electronic components, whereby to electrically connect together said first and second components; and
(d) a dielectric medium encapsulating said electronic components, said lead frame support segment, said interconnecting means and portions of said electrically conductive leads.

* * * * *